United States Patent
Winkler et al.

(10) Patent No.: US 11,285,474 B2
(45) Date of Patent: Mar. 29, 2022

(54) ACOUSTOFLUIDIC COMPONENTS AND PROCESS FOR THEIR PREPARATION

(71) Applicant: LEIBNIZ-INSTITUT FUER FESTKOERPER-UND WERKSTOFFFORSCHUNG DRESDEN E.V., Dresden (DE)

(72) Inventors: Andreas Winkler, Dresden (DE); Christine Henze, Dresden (DE); Thomas Gemming, Dresden (DE)

(73) Assignee: LEIBNIZ-INSTITUT FUER FESTKOERPER-UND WERKSTOFFFORSCHUNG DRESDEN E.V., Dresden (DE)

( * ) Notice: Subject to any disclaimer, the term of this patent is extended or adjusted under 35 U.S.C. 154(b) by 266 days.

(21) Appl. No.: 16/416,860

(22) Filed: May 20, 2019

(65) Prior Publication Data
US 2019/0374941 A1  Dec. 12, 2019

(30) Foreign Application Priority Data
May 22, 2018 (DE) .................. 10 2018 112 258.6

(51) Int. Cl.
| | |
|---|---|
| B01L 3/00 | (2006.01) |
| H01L 41/332 | (2013.01) |
| G01N 29/02 | (2006.01) |
| B06B 1/06 | (2006.01) |
| G03F 7/20 | (2006.01) |

(52) U.S. Cl.
CPC ..... B01L 3/502707 (2013.01); B01L 3/50273 (2013.01); B01L 3/502761 (2013.01); B06B 1/0688 (2013.01); G01N 29/022 (2013.01); H01L 41/332 (2013.01); B01L 2200/0652 (2013.01); B01L 2200/12 (2013.01); B01L 2300/0851 (2013.01); B01L 2300/0858 (2013.01); B01L 2300/12 (2013.01); B01L 2300/16 (2013.01); B01L 2400/0436 (2013.01); B06B 2201/77 (2013.01); G03F 7/2004 (2013.01)

(58) Field of Classification Search
CPC .......... B01L 3/502707; B01L 3/50273; B01L 3/502761; B01L 2400/0436; B01L 2200/12; B01L 2300/0851; B01L 2300/0858; B01L 2300/12; B01L 2300/16; B01L 2200/0652; B01L 2300/0887; H01L 41/332; G01N 29/022; G01N 29/222; B06B 1/0688; B06B 2201/77; G03F 7/2004; G01D 5/48
See application file for complete search history.

(56) References Cited

U.S. PATENT DOCUMENTS

| | | | |
|---|---|---|---|
| 5,129,262 A * | 7/1992 | White | G01H 13/00 310/313 R |
| 6,881,314 B1 * | 4/2005 | Wang | B01D 21/283 204/450 |
| 9,096,823 B1 | 8/2015 | Branch et al. | |
| 9,512,421 B1 | 12/2016 | Branch et al. | |
| 2003/0175947 A1 | 9/2003 | Liu et al. | |
| 2006/0230833 A1 * | 10/2006 | Liu | G01N 29/4481 73/649 |
| 2015/0104845 A1 * | 4/2015 | Huang | B01L 3/502761 435/173.9 |

FOREIGN PATENT DOCUMENTS

WO  2009/014261  1/2009

OTHER PUBLICATIONS

Nach P. Abgrall et al., "A novel fabrication method of flexible and monolithic 3D microfluidic structures using lamination of SU-8 films", J. Micromech. Microeng. 16, (2006), pp. 113-121.
P. Vulto et al., "Microfluidic channel fabrication in dry film resist for production and prototyping of hybrid chips", Lab Chip 2005, 5, ., pp. 158-162.
J.H. Kuypers et al., "Imprinted Laminate Wafer-Level Packaging for SAW ID-Tags and SAW Delay Line Sensors", IEEE Transact. on ultrasonics, ferroelectrics and frequency control, vol. 58, No. 2, Feb. 2011, pp. 406-413.
Patel et al. "Lateral cavity acoustic transducer as an on-chip cell/particle microfluidic switch" Lab Chip, 2012, 12, pp. 139-145.

* cited by examiner

*Primary Examiner* — Jennifer Wecker
*Assistant Examiner* — Oyeleye Alexander Alabi
(74) *Attorney, Agent, or Firm* — Greenblum & Bernstein, P.L.C.

(57) ABSTRACT

Acoustofluidic components in which at least one microfluidic element and at least one acoustic transducer element are arranged on a piezoelectric substrate and/or on a piezoelectric layer on a non-piezoelectric substrate and/or on a non-piezoelectric substrate on a piezoelectric layer. The at least one microfluidic element is arranged in at least one propagation direction of an acoustic wave excited by the acoustic transducer element and the at least one microfluidic element prepared at least partially by lamination and photolithographic structuring comprises a base, walls and a top. At least the top is prepared by lamination and photolithographic structuring, and the microfluidic element has top thicknesses of 0.01 to 10 times the wavelength of the acoustic wave excited by the acoustic transducer element.

16 Claims, No Drawings

ACOUSTOFLUIDIC COMPONENTS AND PROCESS FOR THEIR PREPARATION

CROSS-REFERENCE TO RELATED APPLICATION

This application claims priority under 35 U.S.C. § 119(a) of German Patent Application No. 10 2018 112 258.6, filed May 22, 2018, the disclosure of which is expressly incorporated by reference herein in its entirety.

BACKGROUND

1. Field of the Invention

The invention concerns the fields of microsystems engineering, microfluidics and microacoustics and relates to acoustofluidics components, as for example can be used for actuator or sensory lab-on-a-chip systems or for portable microfluidic systems for field use in the areas of life sciences, bioanalytics, medical engineering, the personalized preparation of medicines and healthcare, or in analytical chemistry and biochemistry.

2. Description of the Background

Microfluidics deals with the behavior of liquids and gases in very small space (Wikipedia, German-language search term "Mikrofluidik"). Microfluidics is also increasingly being used for the analysis or manipulation of fluids, cellular or particle dispersions, and emulsions. For this purpose, what are now referred to as lab-on-a-chip systems (and also referred to as micro total analysis systems, μTAS), are used as microfluidic systems, which combine the functionality of a macroscopic laboratory on a chip substrate. For this purpose, in all lab-on-a-chip-systems it must likewise also be possible to perform the necessary tasks that are carried out on a macroscopic scale (basic laboratory operations). These include, for example, mixing, measuring, causing to react, transporting, analyzing (for example, optically, electrically or acoustically), etc.

According to P. Abgrall et al.: J. Micromech. Microeng. 16 (2006) 113-121, a new preparation process for flexible and monolithically integrated 3D microfluidic structures by means of lamination of SU-8 films is known. According to this publication, uncrosslinked dry SU-8 films are applied on a polyester substrate and laminated therewith onto existing SU-8 structures. A lithographic crosslinking to form closed microstructures then occurs.

According to P. Vulto et al.: Lab Chip 2005, 5, 158-162, the preparation of closed microfluidic channels with the aid of the lamination of dry coating films between two substrates is known.

Lamination is understood on the one hand as meaning a materially-bonded thermal joining process without auxiliary materials, and on the other hand the connection of a thin, often film-like layer to a carrier material by means of an adhesive, and also the connection of two film layers of a thermoplastic by reaching the glass transition temperature with a simultaneous application of a corresponding pressure (Wikipedia, German-language keyword "Lamination").

Furthermore, components are known which utilize surface acoustic waves (SAW) that are solid state sound waves and are propagated on a surface with a penetration depth of a few wavelengths, that is, virtually in only two dimensions (Wikipedia, German-language keyword "akustische Oberflächenwelle"). Also known are components of the type which use bulk acoustic waves that are propagated within materials, or Lamb waves that can be excited in thin plates. Components of this type can be used in a very versatile manner in microfluidics, for example, for sensor or actuator tasks, and are also referred to as acoustofluidic components in this field.

According to J. H. Kuypers et al., IEEE Transact. on ultrasonics, ferroelectrics and frequency control, Vol. 58, No. 2, February 2011, an SAW element is known in which, for the purpose of encapsulation, either (A) a dry film photoresist is locally deformed by means of an imprint process and is subsequently applied on a lithium niobate substrate using lamination and structured by exposure, or (B) two dry film photoresists are consecutively laminated and photolithographically structured in a two-stage process.

A disadvantage of the solutions from the prior art is that it has up to now not been possible to prepare acoustofluidic components with adequately suitable, reproducible properties that are necessary for acoustofluidic surface wave components and also not in large quantities, and that the preparation processes tried and tested in the laboratory are complex and hardly industry-compatible.

SUMMARY

The object of the present invention is to specify acoustofluidic components which can be prepared with improved properties, greater structural accuracy and in large quantities, and to specify a cost-effective and simple process for the preparation thereof.

The object is attained by the invention disclosed in the claims. Advantageous embodiments are the subject matter of the dependent claims.

In the acoustofluidic components according to the invention, at least one microfluidic element and at least one acoustic transducer element are arranged on a piezoelectric substrate and/or on a piezoelectric layer on a non-piezoelectric substrate and/or on a non-piezoelectric substrate on a piezoelectric layer, wherein the at least one microfluidic element is arranged in at least one propagation direction of an acoustic wave excited by the acoustic transducer element and the at least one microfluidic element prepared at least partially by means of lamination and photolithographic structuring comprises a base, walls and a top, wherein at least the top is prepared by means of lamination and photolithographic structuring, and the microfluidic element has top thicknesses of 0.01 to 10 times the wavelength of the acoustic wave excited by the acoustic transducer element.

Advantageously, a plate or a film or a microchip made of glass/glasses/ceramic/ceramics (for example, $SiO_2$, $Al_2O_3$, $Si_3N_4$, SiN, borosilicate glass), piezoelectric materials (for example, quartz, $LiNbO_3$, black $LiNbO_3$, yellow-black $LiNbO_3$, $LiTaO_3$, AlN, Sc—AlN, ZnO, CTGS, langasite, gallium orthophosphate, PZT, PMN-PT, PVDF), metals/metal alloys (for example, Al, Cu, Ti, Ta, TiAl, CuTi) or polymers (PMMA, PTFE, PEEK, polyimide, PET, COP, PDMS, PC, COC, polycaprolactone, PS) or photoresists (for example, SUEX, ADEX, TMMF S2045, Ordyl, SU-8), of semiconductors (Si, GaAs, InAs, GaN) or of combinations of these materials is present as substrate, and/or for which a substrate in form of a layer of the noted materials is present on a non-piezoelectric substrate.

Further advantageously, acoustic transducer elements are present for exciting surface waves, Lamb waves and/or bulk waves.

Likewise advantageously, acoustic transducer elements are present with which wavelengths of less than 1 mm, advantageously between 1 μm and 500 μm, are excited.

And it is also advantageous if microfluidic elements are present which have been prepared by means of a lamination of at least two photolithographically structurable planar elements and subsequent photolithographic structuring on one or more fluidic planes, wherein it is more advantageous if films, film photoresists, glass plates, glass films or polymer films are present as photolithographically structurable planar elements.

It is also advantageous if the walls of the microfluidic elements have a thickness that is smaller than the wavelength of the acoustic wave excited by the acoustic transducer element, and/or with which the walls of the microfluidic elements have a height that is 0.1 to 10 times the wavelength of the acoustic wave excited by the acoustic transducer element.

It is also advantageous if the base of the microfluidic elements is formed by the substrate and/or the coated substrate and/or by the top of a microfluidic element.

It is likewise advantageous if the microfluidic element has top thicknesses of 0.05 to 1 times the wavelength of the acoustic wave excited by the acoustic transducer element.

It is further advantageous if an acoustic transducer element is present by means of which effects such as attenuation, amplification, interference, diffraction, refraction and/or reflection of the excited wave are used in a targeted manner to excite a wave field within the fluid inside of the microfluidic element on at least one fluid plane as a function of the excited acoustic wave and as a function of the geometric dimensions of the microfluidic elements and as a function of the position of the microfluidic element in a propagation direction of an acoustic wave excited by the acoustic transducer element.

It is also advantageous if microfluidic elements and transducer elements are arranged adjacent to and on top of one another on multiple fluidic planes.

It is further advantageous if the walls and/or the base of the microfluidic elements are surface-coated and/or surface-structured and/or deformed.

In the process according to the invention for preparing acoustofluidic components,
  on a piezoelectric substrate and/or on a piezoelectric layer on a non-piezoelectric substrate and/or on a non-piezoelectric substrate on a piezoelectric layer,
  either at least one microfluidic element is created at least partially by means of a lamination of photolithographically structurable planar elements and subsequent photolithographic structuring on one or more fluidic planes,
  or at least one microfluidic element is applied that has already been prepared at least partially by means of a lamination of photolithographically structurable planar elements and subsequent photolithographic structuring on one or more fluidic planes,
  and furthermore at least one acoustic transducer element is applied on the substrate and/or the layer,
  wherein the at least one microfluidic element is arranged in at least one propagation direction of an acoustic wave excited by the acoustic transducer element,
  and wherein the microfluidic elements are prepared with top thicknesses that are equal to 0.01 to 10 times the wavelength of the acoustic wave excited by the acoustic transducer element.

Advantageously, films, film photoresists, glass plates, glass films, or polymer films are used as photolithographically structurable planar elements.

Further advantageously, the microfluidic elements are prepared in that at least one photolithographically structurable planar element is laminated with a temperature increase and application of pressure on a piezoelectric substrate and/or on a piezoelectric layer on a non-piezoelectric substrate and/or on a non-piezoelectric substrate on a piezoelectric layer, and subsequently walls of the microfluidic element are structured photolithographically, and subsequently at least one additional photolithographically structurable planar element is laminated at least partially onto the walls with a temperature increase and an application of pressure and is photolithographically structured to form a top.

Likewise advantageously, the microfluidic elements with the walls and top are arranged once or multiple times simultaneously or consecutively adjacent to and/or on top of one another.

With the invention, it becomes possible for the first time to disclose acoustofluidic components which can be prepared with improved properties, greater structural accuracy and in large quantities, and to prepare acoustofluidic components of this type with a cost-effective and simple process.

DETAILED DESCRIPTION

The greater structural accuracy is necessary, for example, for the targeted excitation of acoustic or electrical wave fields (that is, the spatial distribution of the pressure or of the electric potential in the medium), in particular for resonant fields, for which the reflection on geometric objects and effects such as interference, diffraction and refraction are critical, and cannot be achieved or reproduced without significant effort using conventional processes.

According to the invention, these improvements are essentially achieved by acoustofluidic components that are constructed from at least one microfluidic element and at least one acoustic transducer element on a piezoelectric substrate and/or on a piezoelectric layer on a non-piezoelectric substrate and/or on a non-piezoelectric substrate on a piezoelectric layer.

The microfluidic elements thereby comprise the structures of a base, walls and top known per se from microfluidics engineering, and according to the invention are also simultaneously functional elements for acoustic transducer elements, since according to the invention the at least one microfluidic element is arranged in at least one propagation direction of an acoustic wave excited by the acoustic transducer element.

It is of particular importance according to the invention that, for the first time with the combination of microfluidic elements known per se for the microfluidics and acoustic transducer elements known per se for the excitation of surface acoustic waves, Lamb waves and/or bulk acoustic waves, the microfluidic elements are prepared at least partially by lamination and subsequent photolithographic structuring, wherein at least the top is prepared by means of lamination and photolithographic structuring.

As a result of the lamination of photolithographically structurable planar elements and the subsequent photolithographic structuring, microfluidic elements are present according to the invention which, in order to generate a wave field within the fluid of the microfluidic element, have top thicknesses of 0.01 to 10 times the wavelength of the acoustic wave excited by the acoustic transducer element.

Films, film photoresists, glass plates, glass films, or polymer films can advantageously be present and used as photolithographically structurable planar elements.

According to the invention, the top of the microfluidic element must in each case be composed of a laminated and photolithographically structured material. The walls can also be prepared using conventional processes, and can be composed of other materials.

Through the use of the lamination process known per se for the at least partial preparation of the microfluidic elements, the geometric dimensions of the base, the walls and at least the top of the microfluidic elements can be configured and prepared in significantly smaller dimensions and with considerably higher accuracy and reproducibility, so that the waves excited by the acoustic transducer element in the fluid located in the microfluidic element generate a wave field configured as desired, which wave field produces the desired effects on the fluid. Such effects can, for example, be the generation of a flow or the separation of particles, cells or cellular components, liposomes or exosomes in the fluid.

With the wave field configured as desired in the fluid, the wave properties of attenuation, amplification, interference, diffraction, refraction, and/or reflection of the excited wave can be utilized and configured in a targeted manner to achieve the desired effect. The targeted configuration is realized through the selection of the geometric dimensions (for example, width/height/depth, curvature, roughness) of the bases, walls and tops, and in particular the tops, of the microfluidic elements in combination with the properties of the acoustic transducer elements.

According to the invention, the microfluidic elements must have top thicknesses of 0.01 to 10 times, advantageously 0.1 to 1 times, the wavelength of the acoustic wave excited by the acoustic transducer element.

The walls of the microfluidic elements advantageously have thicknesses that are smaller than the wavelength of the acoustic wave excited by the acoustic transducer element, and/or the walls of the microfluidic elements advantageously have a height that is equal to 0.1 to 10 times the wavelength of the acoustic wave excited by the acoustic transducer element.

In respect of the geometric dimensions of the microfluidic element with regard to the acoustic transducer element, the following criteria can be applied:

The width of the walls of the microfluidic elements in a propagation direction of the acoustic wave should be as much smaller as possible than the acoustic wavelength. Wavelengths of surface acoustic waves are approx. 1-500 µm. Since surface acoustic waves in particular should exhibit a smaller attenuation of the acoustic wave, and therefore also less local heating of the walls, the advantageous wall width of the microfluidic elements is 1-40 µm.

The height of the walls should, particularly for resonant systems of the acoustic transducer elements, be on the order of magnitude of the acoustic wavelength. For the excitation of flows in the fluid, however, the height of the walls should be significantly larger than the acoustic wavelength so that the portions of the wave reflected on the top are sufficiently attenuated in the fluid and do not lead to resonance.

A thickness of the top of 0.01 to 10 times the acoustic wavelength is in the acoustic near-field range. In this range, the top can no longer be considered in a simplified/approximated manner as a half-space; instead, the acoustic propagation in the top has a significant influence on the excited wave field in the microfluidic element. This can be used for the targeted excitation of acoustically induced flows (acoustic streaming) or radiation (acoustic radiation), and therefore for particle/cell manipulation, if effects such as attenuation, amplification, interference, diffraction, refraction, and/or reflection are incorporated.

A very small thickness of the top (0.01 to 0.1 times the acoustic wavelength) can additionally result in a forced total internal reflection of the acoustic wave on the top, and therefore in the excitation of an evanescent acoustic field above the top, that is, outside of the microfluidic element. The acoustic behavior inside the microfluidic element, that is, the excited wave field, thus becomes dependent on the external boundary conditions, for example, the gas atmosphere or applied thin layers (also adsorption), which enables a use as a micro-acoustofluidic sensor or switch.

The shape of the top thereby likewise has an influence, in particular on the reflection of the acoustic waves. The reflection can be influenced via the process-related material stresses and resulting deformations after the lithographic structuring, or through a mechanical and/or thermal embossing of the photolithographically structurable material before the lamination.

It is precisely the influences of attenuation, amplification, interference and/or reflection of the excited wave on the fluid due to the walls and the top of the microfluidic element that could not, or not to a sufficient extent, be accounted for and controlled according to the solutions from the prior art, since no process was previously known yet for preparing the geometric dimensions of microfluidic elements in a desired manner and with corresponding accuracy.

Only through the use of lamination in combination with photolithographic structuring can the geometric dimensions of the parts of microfluidic elements be configured and prepared in a desired manner and accurately enough, whereby the properties of the wave field forming in the fluid can also be configured in a targeted manner.

A plate or a film or a microchip made of glass/glasses/ceramic/ceramics (for example, quartz, $LiNbO_3$, black $LiNbO_3$, yellow-black $LiNbO_3$, $LiTaO_3$, AlN, Sc—AlN, ZnO, CTGS, langasite, gallium orthophosphate, PZT, PMN-PT, PVDF), metals/metal alloys (for example, Al, Cu, Ti, Ta, TiAl, CuTi) or polymers (PMMA, PTFE, PEEK, polyimide, PET, COP, PDMS, PC, COC, polycaprolactone, PS) or photoresists (for example, SUEX, ADEX, TMMF S2045, Ordyl, SU-8), of semiconductors (Si, GaAs, InAs, GaN) or of combinations of these materials can be present as substrate for the acoustofluidic components according to the invention, and/or a layer of the noted materials can be present and used on a non-piezoelectric substrate.

The piezoelectric substrate and/or the piezoelectric layer in many cases form the base (bottom) of the microfluidic elements. However, the microfluidic elements can advantageously also be arranged on top of and/or adjacent to one another once or multiple times, such that it is also possible that the base of one microfluidic element is formed by the top or the walls of another microfluidic element.

Through the possible three-dimensional construction of multiple microfluidic components used according to the invention adjacent to and/or on top of one another, a three-dimensional construction of an overall acoustofluidic system can also be achieved, which construction can, for example, also realize a flow of a fluid over the height of the overall system.

The acoustic transducer element present according to the invention is composed of one or more acoustic transducers, for example, interdigital transducers (IDT) or plate oscillators (volume oscillators or shear oscillators) on a piezoelectric substrate and/or on a piezoelectric layer on a non-piezoelectric substrate and/or on a non-piezoelectric substrate on a piezoelectric layer. The dimensions of the IDTs determine the type (mode) and power (amplitude) of the excited acoustic wave. For example, surface acoustic waves, Lamb waves and/or bulk acoustic waves can be excited.

Advantageously, acoustic waves with wavelengths of less than 1 mm, advantageously between 1 μm and 500 μm, can be excited with the acoustic transducer elements present according to the invention.

It is particularly advantageous according to the invention that the walls and/or the base of the microfluidic elements can be surface-coated and/or surface-structured. For this purpose, photolithographically structurable planar elements that are already surface-coated and/or surface-structured can be used, for example, or the surface structuring can be carried out during the photolithographic structuring.

Surface coatings of this type can, for example, be electrodes or protective layers or adhesive layers or layers of biocompatible or inert materials or coatings that enter into chemical and/or physical interaction with the fluid, such as triggering chemical or catalytic reactions, for example; or they can be optically or acoustically active layers. Through a partial surface coating, the location of such an interaction in the overall acoustofluidic component or in the overall construction of multiple acoustofluidic components can thereby also be selected in a targeted manner.

Desired surface structurings can, for example, be different roughnesses of the surfaces or phononic structures.

Deformations of walls and/or the top of the microfluidic elements can advantageously be achieved through the use of previously formed photolithographically structurable planar elements, or by printing or embossing previously laminated and/or photolithographically structured, but not yet cured planar elements. Likewise possible is the use of intrinsic stresses of the materials of the constituents of the microfluidic components or the introduction of, for example, thermally induced stresses in the constituents of the microfluidic components during the lamination and/or the photolithographic structuring of the microfluidic components in order to produce deformations.

According to the invention, acoustofluidic components are prepared in that
  on a piezoelectric substrate and/or on a piezoelectric layer on a non-piezoelectric substrate and/or on a non-piezoelectric substrate on a piezoelectric layer
  at least one acoustic transducer element is created by lithographic structuring, and
  either at least one microfluidic element is created at least partially by means of a lamination of photolithographically structurable planar elements and subsequent photolithographic structuring on one or more fluidic planes,
  or at least one microfluidic element is applied that has already been prepared at least partially by means of a lamination of photolithographically structurable planar elements and subsequent photolithographic structuring on one or more fluidic planes.

An advantage of the preparation of the microfluidic elements is that the microfluidic elements at least partially prepared by means of a lamination of photolithographically structurable planar elements and subsequent photolithographic structuring on one or more fluidic planes have been prepared from walls and a top prior to the positioning thereof on the piezoelectric substrate and/or the piezoelectric layer. These microfluidic elements prepared in advance are thereby not completely finished in every case, since for example the base can be missing, whereby the base is formed by the piezoelectric substrate or the piezoelectric layer after the positioning.

Furthermore, the microfluidic elements prepared in advance could be prepared separately in mass production and could then be positioned on the substrate or the layer.

Likewise, these microfluidic elements prepared in advance can already be surface-coated, surface-structured and/or formed before the positioning thereof.

However, according to the invention, it is likewise possible that the microfluidic element is applied directly on the substrate and/or the layer at least partially by means of a lamination of photolithographically structurable planar elements and subsequent photolithographic structuring on one or more fluidic planes.

It is also advantageous if two or more photolithographically structurable planar elements are applied by means of lamination, since the possibilities for photolithographic structurings are thus expanded.

According to the invention, at least one acoustic transducer element is applied on the substrate and/or the layer beforehand, simultaneously or afterward.

For the positioning of the microfluidic elements and of the acoustic transducer elements on the substrate and/or the layer, it must be taken into account that the at least one microfluidic element is arranged in at least one propagation direction of an acoustic wave excited by the acoustic transducer element.

An advantageous embodiment of the arrangement of multiple microfluidic elements on the substrate and/or the layer is, according to the invention, also constituted by the microfluidic elements prepared at least partially by means of a lamination of photolithographically structurable planar elements and subsequent photolithographic structuring being applied adjacent to and on top of one another. With a plurality of microfluidic elements and also acoustic transducer elements, a three-dimensional construction can be achieved on multiple fluidic planes.

According to the invention, it is furthermore necessary that the microfluidic elements are prepared with top thicknesses that are equal to 0.01 to 10 times the wavelength of the acoustic wave excited by the acoustic transducer element.

Advantageously, films, film photoresists, glass plates, glass films, or polymer films are used as photolithographically structurable planar elements.

The dimensions of such planar elements that can be used according to the invention can be any desired length and width. By contrast, the thickness of the planar elements is of critical importance for achieving the top thicknesses. The thicknesses of the usable planar elements that are commercially available or can be industrially prepared are between 1 and 500 μm.

Likewise advantageously, all parts of the microfluidic elements present according to the invention can be prepared by means of lamination and subsequent photolithographic structuring. At least the top of one microfluidic element must thereby be prepared at least partially by means of a lamination of a photolithographically structurable planar element and subsequent photolithographic structuring.

The preparation according to the invention by means of lamination and subsequent photolithographic structuring can, in addition to the top, also apply to the walls as well as the base of the microfluidic elements, provided that the base is not formed by the substrate or the layer on a substrate.

In each case, however, the top of the microfluidic elements must be prepared as part of the acoustofluidic component according to the invention by means of lamination and subsequent photolithographic structuring.

The walls and the top of a microfluidic element according to the invention can thereby be prepared in one process step from a photolithographically structurable planar element, for example, in a curved shape. The cross-sections of the microfluidic elements do not need to be rectangular or square, but rather can also be formed in any desired manner.

The process step of lamination takes place through the application of the photolithographically structurable planar elements in the desired position with a simultaneous application of pressure and temperature, as a function of the glass temperature of the laminating materials and the geometric dimensions of structures that are already present, for example, the substrate size or the geometry of existing microfluidic components or the constituents thereof. The photolithographic structuring is then carried out using processes known per se. These processes involve different temperature treatments (for example, soft bake, hard bake), exposure, at least with light of an optical wavelength, and development steps (wet-chemical or dry-physical).

Advantageously, a photolithographically structurable planar element can first be laminated and therein walls of the microfluidic element structured photolithographically, and subsequently at least one additional photolithographically structurable planar element can be at least partially laminated onto the walls and photolithographically structured to form a top.

As is known, the lamination takes place in the following steps:
1. Cleaning of the substrate surface,
2. Lamination of a film during an application of pressure with a simultaneous temperature increase in the range of the glass transition temperature of the film and with an adaptation of the pressing force/pressure to the thickness of the film and substrate,
3. (if a protective film is present on the laminating film, the protective film must then be removed),
4. Multiple laminating operations are consecutively possible, for example, in order to increase the layer thickness in a targeted manner.

After the lamination, the additional processing steps of exposure=>post-curing=>development in a chemical developer (possibly with ultrasonic treatment for increasing efficiency)=>cleaning are generally carried out in order to prepare the laminated end product. The specific process sequence depends on the film material used and the properties thereof and the desired laminated end product.

With the solution according to the invention, it is for the first time possible to simultaneously position a microfluidic element and an acoustic transducer element on one substrate and, through the configurability and accuracy of the geometric dimensions and positioning of the microfluidic element, to achieve a wave field that can be configured in a targeted manner in the fluid in the microfluidic element.

The acoustofluidic components according to the invention can, for example, be used in the field of actuators for impedance spectroscopy, particle separation, acoustic tweezers/mixers, dielectrophoresis, acoustophoresis, pumps or artificial muscles, and in the field of sensors for microacoustic viscosity measurement, conductivity measurement, temperature measurement, biological sensor technology (layer growth, reaction kinetics), moisture measurement, pH value measurement, gas sensor technology, or in molecular sensors.

The invention is explained below in greater detail with the aid of an exemplary embodiment.

Example 1

On a 4-inch wafer of piezoelectric yellow-black 128° YX lithium niobate ($LiNbO_3$) as substrate, chips having respectively two interdigital transducer pairs (IDT pairs for short) and peripheral structures such as dicing marks, electrical feed electrodes with contact structures and alignment marks for the lamination are created as acoustic transducer elements by means of lift-off structuring. The metallization is applied on the photolithographically structured coating layer by means of electron beam evaporation and is composed of 5 nm of titanium (as an adhesive layer) with an overlying 295 nm of aluminum.

Of the two interdigital transducer pairs, the first pair is composed of two interdigital transducers of the quarter-wave (lambda-quarter) type with widths of the finger electrodes or the empty spaces between of respectively 75 µm (the SAW wavelength is therefore 300 µm), an aperture of 3 mm, and 20 pairs of fingers, wherein the interdigital transducers have a distance from one another of 900 µm in a propagation direction of the excited surface wave, and the second pair is composed of two interdigital transducers of the quarter-wave type with widths of the finger electrodes and the empty spaces therebetween of respectively 50 µm (the SAW wavelength is therefore 200 µm), an aperture of 2 mm, and 32 pairs of fingers, wherein the interdigital transducers have a distance from one another, that is, perpendicular to the finger electrodes, of 800 µm. The propagation direction of both IDT pairs is the crystallographic X direction (perpendicular to the wafer flat and perpendicular to the finger electrodes of the IDTs) and the lateral distance between the IDT pairs is 1.5 mm. All four IDTs have electrical feeds (bus bars) arranged laterally on the finger electrodes with a 200 µm width over the entire IDT length and end at 1 mm×1 mm contact points at a distance of 500 µm from the chip edge. Spring contact pins for coupling the high-frequency signal from an external electrical peripheral are attached to these electrical contact points during use.

After the lift-off of the metallization, a 100-nm thick $SiO_2$ layer is applied as a biocompatible functional layer by means of sputtering. The $SiO_2$ layer is then etched off at the electrical contact points using physical dry etching.

On the substrate, a 20-nm thick Ti layer is then structured as an adhesive layer by means of lift-off technology. The geometry and position of the Ti layer corresponds to that of the walls of the microfluidic element created in the subsequent step. Then, a 100-µm thick film of ADEX dry film photoresist is laminated onto the substrate with the Ti layer according to the instructions of the film manufacturer with the aid of a film laminator, and is subsequently structured to form the walls of the microfluidic element by means of photolithography. Two parallel walls thereby form an open channel with a wall thickness of 25 µm and a distance of 150 µm, whereby the channel is located parallel to the finger electrodes in a centered manner between the IDTs of both IDT pairs. In both directions (parallel to the finger electrodes), the channel ends at a distance of 5 mm from the center between the IDT pairs in T-shaped junctions, each having three channels with a respective 35 µm wall width and 50 µm channel width. These end in one fluidic contact point each, with a circular, centrally arranged opening with an 800 µm diameter and a 2.5 mm outer diameter. During use, sealing rings are attached to these fluidic contact points, which rings are connected to an external fluidic peripheral.

A 10-µm thick film (for a top thickness of 10 µm, or 0.033 times the 300 µm SAW wavelengths used for the first transducer pair and 0.05 times the 200 µm SAW wavelengths used for the second transducer pair) of ADEX dry photoresist is subsequently laminated onto the walls of the microfluidic element according to the instructions of the film manufacturer with the aid of a film laminator, and is then structured to form the tops of the microfluidic elements by means of photolithography. The area of the top is thereby bounded between the outer structures of the walls of the microfluidic element and the circular openings of the fluidic contact points.

At the present time, these two-layer, partially closed microfluidic elements according to the invention can only be prepared with the aid of laminating technology. Furthermore, the thickness of the top can thus be configured to be 0.033 times or 0.05 times the wavelengths used for the acoustic wave, whereby compared to the standard element with a PDMS microfluidic element, a wave-field resonance that is increased by a factor of 5 can be achieved simultaneously with an acoustic flow that is increased by a factor of 4. Furthermore, in this manner all elements necessary for the microfluidic manipulation of fluids with or without cells or particles can be prepared on a chip or wafer substrate in cleanroom technology/photolithographic technology. As a result, the handling and preparation costs decrease by 50%.

The photolithographic exposure of the laminated films takes place by means of photolithography with a wavelength of 365 nm in a mask aligner with the aid of structured quartz/chromium lithography masks.

To electrically activate the interdigital transducer, a sine wave generator is used which is operated at the resonant frequency of the interdigital transducers (approx. 13 MHz and approx. 20 MHz, respectively) and to the output of which a 2 W high-frequency amplifier is connected. The interdigital transducers are connected to the output via spring contact pins and SMA connecting cables.

The fluidic contact points are directly connected via a rubber ring to a pressure plate with a liquid reservoir. When liquid is added to the reservoir with the aid of a pump, it fills the channel from one side to the other. The outer channel access points are thereby used for the hydrodynamic pre-focusing of the liquid in the inner channel access point. The inner channel access point contains differently sized cells with a diameter of 2-20 µm.

During operation, sinusoidal signals are applied to both IDT pairs at the resonance frequency of the IDTs and 200 mW of electrical power, whereby the interdigital transducers emit Rayleigh-type surface acoustic waves that form standing SAWs in the center of the IDTs of the IDT pairs. The first IDT pair (300 SAW wavelength) is thereby used to focus the cells in the center of the channel. The second IDT pair (200 µm SAW wavelength) is used to split the focused cell flow into two fractions. One fraction thereby remains in the center of the channel and is transported to the centrally arranged channel outflow, and the second fraction is transported in the direction of the channel walls and to the outer channel outflows.

The invention claimed is:

1. Acoustofluidic components comprising:
at least one microfluidic element and at least one acoustic transducer element arranged on a piezoelectric substrate and/or on a piezoelectric layer on a non-piezoelectric substrate and/or on a non-piezoelectric substrate on a piezoelectric layer;
the at least one microfluidic element being arranged in at least one propagation direction of an acoustic wave excited by the acoustic transducer element, wherein the microfluidic elements present have been prepared by a lamination of at least two photolithographically structurable planar elements and subsequent photolithographic structuring on one or more fluidic planes, and wherein said at least two photolithographically structurable planar element is selected from films, film photoresists, glass plates, glass films, or polymer films are present as photolithographically structurable planar elements;
and the at least one microfluidic element comprising an at least partial lamination and photolithographic structure comprising:
a base, walls, and a top; and at least the top comprises a lamination and photolithographic structure; and
the at least one microfluidic element having top thicknesses of 0.01 to 10 times a wavelength of the acoustic wave excited by the acoustic transducer element.

2. The acoustofluidic components according to claim 1, wherein:
a plate or a film or a microchip made of glass/glasses/ceramic/ceramics, piezoelectric materials, metals/metal alloys, or polymers, or photoresists, of semiconductors, or of combinations of such foregoing materials is present as substrate, and/or in which as substrate a layer of the noted materials is present on a non-piezoelectric substrate.

3. The acoustofluidic components according to claim 1, wherein:
a plate or a film or a microchip made of glass/glasses/ceramic/ceramics (for example, SiO2, Al2O3, Si3N4, TiN, SiN, borosilicate glass), piezoelectric materials (for example, quartz, LiNbO3, black LiNbO3, yellow-black LiNbO3, LiTaO3, AlN, Sc—AlN, ZnO, CTGS, langasite, gallium orthophosphate, PZT, PMN-PT, PVDF), metals/metal alloys (for example, Al, Cu, Ti, Ta, TiAl, CuTi) or polymers (PMMA, PTFE, PEEK, polyimide, PET, COP, PDMS, PC, COC, polycaprolactone, PS) or photoresists (for example, SUEX, ADEX, TMMF S2045, Ordyl, SU-8), of semiconductors (Si, GaAs, InAs, GaN) or of combinations of these materials is present as substrate, and/or in which as substrate a layer of the noted materials is present on a non-piezoelectric substrate.

4. The acoustofluidic components according to claim 1, wherein:
acoustic transducer elements are present for exciting surface waves, Lamb waves, and/or bulk waves.

5. The acoustofluidic components according to claim 1, wherein: the acoustic transducer elements are present with which wavelengths of less than 1 mm are excited.

6. The acoustofluidic components according to claim 1, wherein: the acoustic transducer elements are present with which wavelengths between 1 m and 500 m are excited.

7. The acoustofluidic components according to claim 1, wherein:
microfluidic elements are present which have been prepared by a lamination of at least two photolithographically structurable planar elements and subsequent photolithographic structuring on one or more fluidic planes.

8. The acoustofluidic components according to claim 7, wherein:

films, film photoresists, glass plates, glass films, or polymer films are present as photolithographically structurable planar elements.

9. The acoustofluidic components according to claim 1, wherein:
the walls of the microfluidic elements have a thickness that is smaller than the wavelength of the acoustic wave excited by the acoustic transducer element, and/or in which the walls of the microfluidic elements have a height that is 0.1 to 10 times the wavelength of the acoustic wave excited by the acoustic transducer element.

10. The acoustofluidic components according to claim 1, wherein:
the base of the microfluidic elements is formed by the substrate and/or the coated substrate and/or by the top of a microfluidic element.

11. The acoustofluidic components according to claim 1, wherein:
the microfluidic element has top thicknesses of 0.05 to 1 times the wavelength of the acoustic wave excited by the acoustic transducer element.

12. The acoustofluidic components according to claim 1, wherein:
an acoustic transducer element is present by which effects comprising at least one of attenuation, amplification, interference, diffraction, refraction or reflection of the excited wave are targeted to excite a wave field within the fluid inside the microfluidic element on at least one plane as a function of the excited acoustic wave and as a function of geometric dimensions of the microfluidic elements and as a function of a position of the microfluidic element in a propagation direction of an acoustic wave excited by the acoustic transducer element.

13. The acoustofluidic components according to claim 1, wherein:
the walls and/or the base of the microfluidic elements are surface-coated and/or surface-structured and/or deformed.

14. A process for preparing acoustofluidic components in which, on a piezoelectric substrate and/or on a piezoelectric layer on a non-piezoelectric substrate and/or on a non-piezoelectric substrate on a piezoelectric layer, said process comprising:

creating either at least one microfluidic element at least partially by a lamination of photolithographically structurable planar elements and subsequent photolithographic structuring on one or more fluidic planes; or applying at least one microfluidic element that has already been prepared at least partially by a lamination of photolithographically structurable planar elements and subsequent photolithographic structuring on one or more fluidic planes, and wherein: films, film photoresists, glass plates, glass films, or polymer films are present as photolithographically structurable planar elements, and, furthermore, applying at least one acoustic transducer element on the substrate and/or the layer;

arranging the at least one microfluidic element in at least one propagation direction of an acoustic wave excited by the acoustic transducer element, and preparing the microfluidic elements with top thicknesses that are equal to 0.01 to 10 times the wavelength of the acoustic wave excited by the acoustic transducer element.

15. The process according to claim 14, further comprising:
using films, film photoresists, glass plates, glass films, or polymer films as photolithographically structurable planar elements.

16. The process according to claim 14, further comprising:
preparing the microfluidic elements such that at least one photolithographically structurable planar element is laminated with a temperature increase and application of pressure on a piezoelectric substrate and/or on a piezoelectric layer on a non-piezoelectric substrate and/or on a non-piezoelectric substrate on a piezoelectric layer, and, subsequently, walls of the microfluidic element are structured photolithographically, and, subsequently, at least one additional photolithographically structurable planar element is laminated at least partially onto the walls with a temperature increase and an application of pressure and is photolithographically structured to form a top.

* * * * *